(12) United States Patent
Kashino

(10) Patent No.: US 6,890,383 B2
(45) Date of Patent: May 10, 2005

(54) METHOD OF MANUFACTURING SEMICONDUCTOR WAFER AND SUSCEPTOR USED THEREFOR

(75) Inventor: Hisashi Kashino, Annaka (JP)

(73) Assignee: Shin-Etsu Handotai Co., Ltd., Tokyo (JP)

( * ) Notice: Subject to any disclaimer, the term of this patent is extended or adjusted under 35 U.S.C. 154(b) by 70 days.

(21) Appl. No.: 10/477,918

(22) PCT Filed: May 30, 2002

(86) PCT No.: PCT/JP02/05276

§ 371 (c)(1),
(2), (4) Date: Nov. 18, 2003

(87) PCT Pub. No.: WO02/097872

PCT Pub. Date: Dec. 5, 2002

(65) Prior Publication Data

US 2004/0129225 A1 Jul. 8, 2004

(30) Foreign Application Priority Data

May 31, 2001 (JP) ........................ 2001-165165

(51) Int. Cl.[7] .......................... C30B 33/00; H01L 21/26
(52) U.S. Cl. ........................................... 117/3; 438/795
(58) Field of Search ................................. 438/478, 800, 438/795; 432/253; 117/3

(56) References Cited

U.S. PATENT DOCUMENTS

| 5,514,439 | A | * | 5/1996 | Sibley ........................ 428/64.1 |
| 5,761,023 | A | * | 6/1998 | Lue et al. .................... 361/234 |
| 6,245,152 | B1 | * | 6/2001 | Imai et al. ................... 118/728 |
| 6,394,797 | B1 | * | 5/2002 | Sugaya et al. ............... 432/253 |
| 6,634,882 | B2 | * | 10/2003 | Goodman .................... 432/253 |

FOREIGN PATENT DOCUMENTS

| JP | A 2-174116 | 7/1990 |
| JP | A 4-14216 | 1/1992 |
| JP | A 5-238882 | 9/1993 |
| JP | A 8-70034 | 3/1996 |

* cited by examiner

*Primary Examiner*—Evan Pert
*Assistant Examiner*—Scott B. Geyer
(74) *Attorney, Agent, or Firm*—Oliff & Berridge, PLC

(57) ABSTRACT

A semiconductor wafer manufacturing method comprising mounting a single crystal silicon wafer (W) in a pocket (11) arranged in a susceptor (10), and performing heat treatment for the single crystal silicon wafer (W) to manufacture a semiconductor wafer, wherein a contact ratio of the pocket (11) with the single crystal silicon wafer (W) is set to 0.1% or more and 1.1% or less.

10 Claims, 6 Drawing Sheets

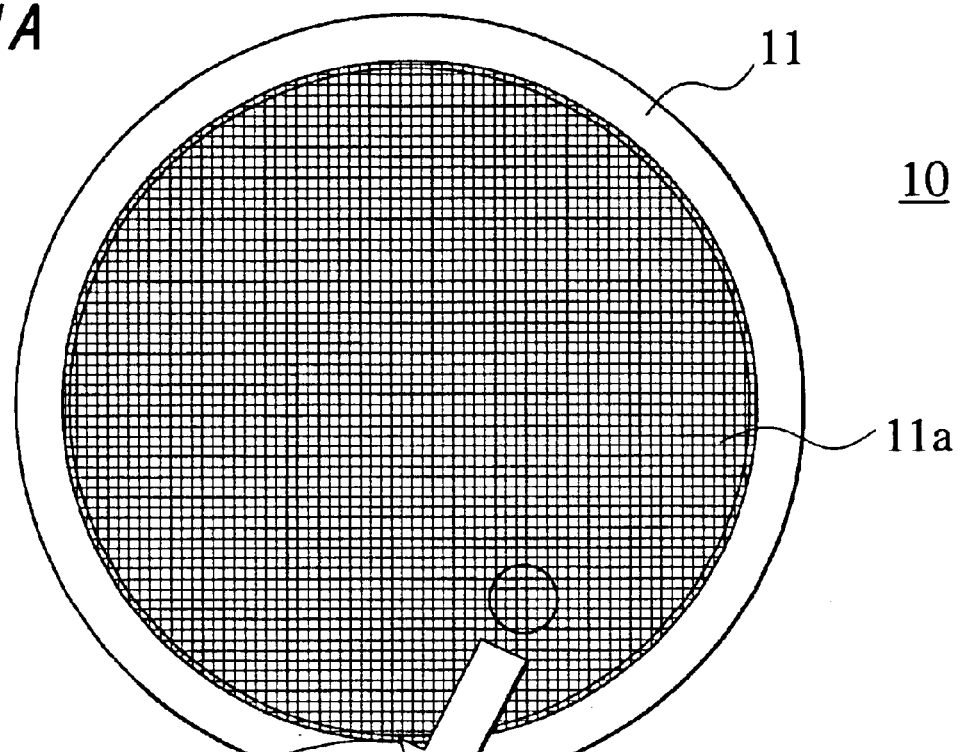
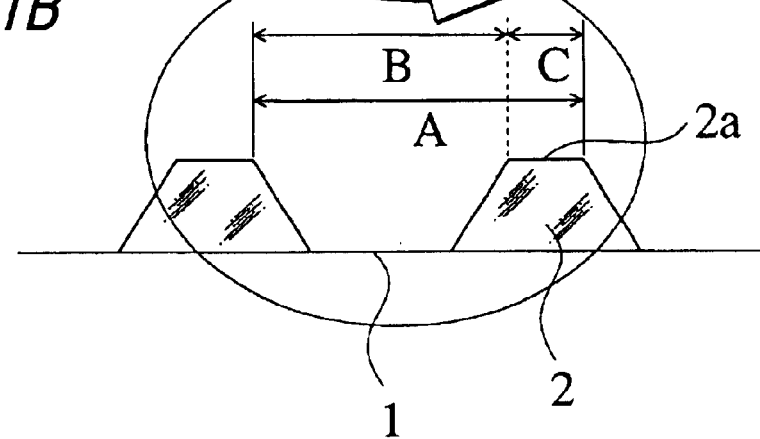

METHOD OF MANUFACTURING SEMICONDUCTOR WAFER AND SUSCEPTOR USED THEREFOR

TECHNICAL FIELD

This invention relates to a method of manufacturing a semiconductor wafer and a susceptor used therefor in which a single crystal silicon wafer is mounted on the susceptor for heat treatment to manufacture a semiconductor wafer.

BACKGROUND ART

In the process for manufacturing semiconductors from single crystal silicon wafers (hereinafter, named "wafer"), various types of heat treatment are performed for the wafers by using various apparatuses. As main methods for mounting the wafers on each of the apparatuses, there are provided a first method for arranging the wafers in the apparatus in line in standing condition while supporting the periphery edge portion of each wafer and a second method for mounting the/each wafer(s) on a susceptor in the apparatus while holding the back surface side of the wafer(s). In the second method, when the heat treatment is, for example, performed for the vapor-phase epitaxial growth, a single wafer processing type, a pancake type and barrel type (or cylinder type) apparatuses are known. In the single wafer processing type apparatus, the heat treatment is performed for the wafer each time one of the wafers is mounted on the susceptor. In the pancake or barrel type apparatus, the heat treatment is simultaneously performed for a plurality of wafers arranged in line on the susceptor. In the single wafer processing type, the pancake type and the barrel type apparatuses, a circular concavity (pocket) is formed at a wafer mounting position on the susceptor. The pocket is generally made of carbon coated with silicon carbide. Diameter and depth of the pocket are designed while considering diameter and thickness of a wafer to be processed, and conditions for appropriately performing the heat treatment of the vapor-phase epitaxial growth or the like for the wafer.

In a case where the bottom of the pocket is formed on a flat surface, when a wafer W is mounted on the susceptor, the wafer easily slides on the pocket.

To prevent sliding of a wafer, grooves are, for example, cut in a lattice shape in the bottom surface portion of the pocket to form a large number of convexities formed in a trapezoid shape, as shown in FIG. 1A. Therefore, when a wafer is mounted on the bottom of the pocket, the wafer is held by the large number of convexities from the side of the back surface thereof.

In the apparatus described above, before the heat treatment, a wafer is transferred from a standby position to the susceptor, on which the heat treatment is performed, by a transfer system such as a Bernoulli-chuck transfer system or the like, and the wafer is mounted in the pocket formed in the susceptor. After the heat treatment, the wafer is transferred to the standby position to be carried out to the outside of the apparatus. This series of operations are successively performed in the apparatus. After completing the series of operations, heat treatment operations for a next unprocessed wafer are started.

Heat treatment for manufacturing a semiconductor wafer is usually performed at a high temperature atmosphere. Therefore, the pocket of the susceptor is heated to a high temperature by a high radio frequency coil, lamp or the like to heighten the wafer to a predetermined temperature.

In the apparatus described above, when the heat treatment is successively performed for the wafers, an unprocessed wafer transferred to a reaction furnace is mounted on the susceptor already heated up to a high temperature. In this case, the lower surface of the wafer is rapidly heated up at the moment when the wafer contacts with the bottom of the pocket of the susceptor. As a result, as shown in FIG. 6, the wafer is momentarily warped upward. For example, when a wafer W having a diameter of 200 mm is mounted on a susceptor 10 heated up to about 600° C., a warp momentarily occurring upward in the wafer W is observed. In this observation, a distance (amount of warp of wafer) D from one backside edge of the wafer W to the bottom of the pocket momentarily reaches about 3.2 mm.

This warp momentarily occurs in the wafer W. However, when the transfer system such as the Bernoulli-chuck is, for example, placed to be close to the wafer W, the wafer W comes in contact with the transfer system at the moment when the wafer W is warped upward, and a problem is arisen that scratches are sometimes generated on a surface of the wafer W.

An object of the present invention is to provide a method of manufacturing a semiconductor wafer and a susceptor used therefor in which warp of a single crystal silicon wafer occurring at the moment of mounting the single crystal silicon wafer on the susceptor can be lessened in the manufacturing process of the semiconductor wafer.

DISCLOSURE OF THE INVENTION

According to the problem described above, the inventor of the present invention examined the transferring and mounting of the wafer W in the apparatus. As a result, as shown in FIG. 2, the inventor understood that warp of the wafer W is lessened so as to mount the wafer W in a stable condition when the intervals of convexities formed in the pocket of the susceptor are lengthened.

When the intervals of the convexities being in contact with the wafer W on the bottom of the pocket are changed, the number of convexities per a unit area is changed, and a contact ratio of the pocket with the wafer is changed. Therefore, the inventor thought that the amount of warp of the wafer W could be lessened by adjusting the contact ratio.

The inventor understood that, as a result of the examination, for example, when a wafer is mounted in the pocket of the susceptor set to 600° C., if the contact ratio is set to 1.1% or less, or more preferably set to 1% or less (groove width of 1.8 mm or more), the amount of warp of the wafer W can be largely lessened and the generation of scratches in the wafer W can be prevented.

However, when the intervals of the convexities are set to be larger than a certain value, because heat is not sufficiently transferred from the pocket to the wafer, slip dislocation occurs in the wafer. Therefore, the lower limit of the contact ratio of the pocket with the wafer is preferably set to 0.1% or more to suppress the occurrence of the slip dislocation.

According to the first aspect of the present invention, a method of manufacturing a semiconductor wafer according to the present invention comprises mounting a single crystal silicon wafer in a pocket arranged in a susceptor, and performing heat treatment for the single crystal silicon wafer to manufacture the semiconductor wafer, wherein a contact ratio of the pocket with the single crystal silicon wafer is set to 0.1% or more and 1.1% or less.

The contact ratio of the pocket with the single crystal silicon wafer can be adjusted, for example, by forming grooves in the pocket in a lattice shape so as to enlarge the width of the grooves.

In this case, the width of each groove formed in the pocket is preferably set to 1.8 mm or more.

More preferably, the contact ratio is set to 0.1% or more and 1% or less.

The pocket is, for example, applied to the susceptor used in the single wafer processing type apparatus, the pancake type apparatus and the barrel type apparatus which are selected from various apparatuses for performing heat treatment of the wafer such as an apparatus for performing vapor-phase epitaxial growth, a CVD apparatus and the like and are characterized by mounting a single crystal silicon wafer on the pocket while the back surface of the wafer is in contact with the pocket. Also, the grooves formed in the pocket can be formed according to machine work. Material of the susceptor is preferably carbon coated with silicon carbide, and the susceptor may be occasionally made of quartz, silicon or the like.

In the method of manufacturing the semiconductor wafer according to the present invention, because warp of the wafer mounted on the susceptor is largely lessened, contact of the wafer with a member such as a transfer system placed close to the wafer can be prevented, and generation of scratches on the surface of the wafer due to warp of the wafer can be prevented.

According to the second aspect of the present invention, a method of manufacturing a semiconductor wafer according to the present invention comprises mounting a single crystal silicon wafer in a pocket arranged in a susceptor, and performing heat treatment for the single crystal silicon wafer to manufacture a semiconductor wafer, wherein a contact ratio of the pocket with the single crystal silicon wafer is set to 0.1% or more and 0.3% or less when a temperature in the susceptor is about 900° C.

According to the third aspect of the present invention, a susceptor of the present invention having a pocket for mounting a single crystal silicon wafer and used to manufacture a semiconductor wafer., wherein a contact ratio of the pocket with the single crystal silicon wafer is set to 0.1% or more and 1.1% or less.

According to the fourth aspect of the present invention, a susceptor of the present invention having a pocket for mounting a single crystal silicon wafer and used to manufacture a semiconductor wafer, wherein a contact ratio of the pocket with the single crystal silicon wafer is set to 0.1% or more and 0.3% or less when a temperature in the susceptor is about 900° C.

BRIEF DESCRIPTION OF DRAWINGS

FIG. 1A is an upper view showing the bottom of a pocket of a susceptor used for a semiconductor wafer manufacturing method according to the present invention;

FIG. 1B is an enlarged sectional view showing the bottom of the pocket of the susceptor used for the semiconductor wafer manufacturing method according to the present invention;

BEST MODE FOR CARRYING OUT THE INVENTION

Figure 2:
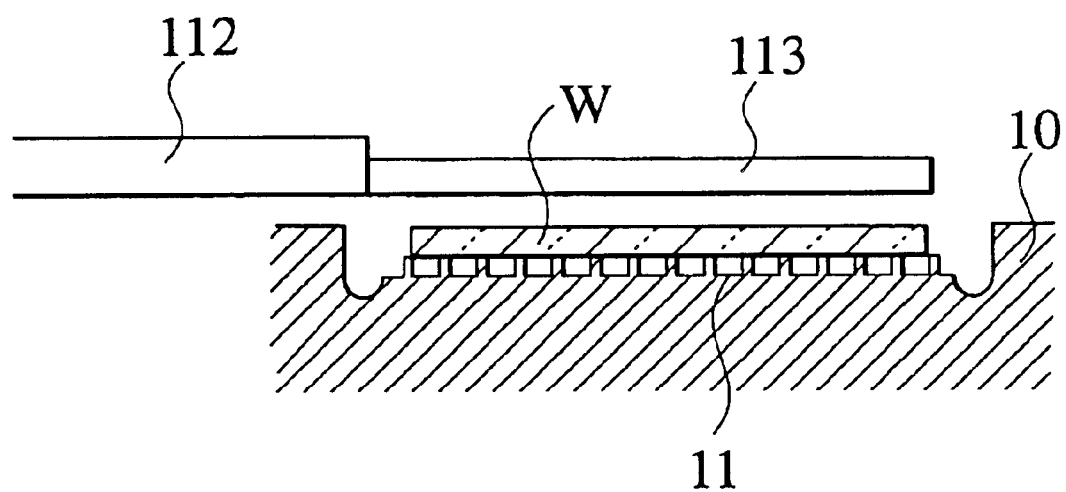
FIG. 2 is a sectional view showing a wafer W mounted on the pocket of the susceptor in a warp lessened condition.

In this embodiment, a semiconductor wafer manufacturing method for forming a single crystal thin film by performing vapor-phase epitaxial growth on a main surface of a wafer W will be described as an example of the heat treatment according to the present invention. This vapor-phase epitaxial growth is performed in a single wafer processing type vapor-phase growth apparatus 100 shown in FIG. 3.

The vapor-phase growth apparatus 100 comprises a reaction furnace 101, load-lock chambers 102 and 103, and a transfer chamber 104 placed between the reaction furnace 101 and the load-lock chambers 102 and 103. The reaction furnace 101 and the transfer chamber 104 are partitioned by an open-close type gate valve 105.

Each of the load-lock chambers 102 and 103 acts as a place for loading and unloading wafers in/from the vapor-phase growth apparatus 100, and plurality of wafers W of before-vapor-phase-epitaxial-growth (hereinafter, named "pre-treatment") are normally mounted on a cassette (not shown) respectively along the upper-lower direction while the main surfaces of the wafers W are placed upward. The wafers W are transferred one by one to the transfer chamber 104. After performing the vapor-phase epitaxial growth (hereinafter, named "post-treatment") for each wafer W, the wafers W are transferred to the load-lock chamber 102 or 103 to return the wafers W in a cassette.

The transfer chamber 104 acts as a place at which a wafer W is transferred between the reaction furnace 101 and the load-lock chambers 102 and 103, and the transfer chamber 104 has a handler 110 denoting a holding and transfer unit of the wafer W.

The handler 110 comprises an arm 112 attached to be able to perform reciprocating and rotational movement, expand and contract in a horizontal direction around a support point 111 which is placed almost at the center of the transfer chamber 104, and a disc-shaped chuck 113, arranged at the end of the arm 112, for holding the wafer W. The arm 112 comprises first links 112a, 112a and second links 112b, 112b. The arm 112 is expanded and contracted by moving the pairs of the links 112a and 112b connected to support points 112c, 112c respectively around the support points 112c, 112c in directions which make the links 112a and 112b be away from each other and overlapping with each other.

The transfer of the single crystal silicon wafer performed by the handler 110 is based on Bernoulli-chuck method. In detail, gas such as nitrogen or the like is strongly blown from the center of the chuck 113 to the periphery, and the wafer W is adsorbed and held by the chuck 113 without contacting to the chuck 113 in the neighborhood of the lower surface of the chuck 113 according to the Bernoulli's effect. The arm 112 is then rotationally moved at the same time, expanded and contracted to move the chuck 113 while keeping the holding of the wafer W, and the wafer W is moved. When the chuck 113 arrives at the position at which the wafer W should be mounted in the reaction furnace 101, the gas flow of the chuck 113 is changed to release the holding of the wafer W, so that the wafer W is apart from the chuck 113 and is mounted at a predetermined position under the chuck 113.

Figure 3:
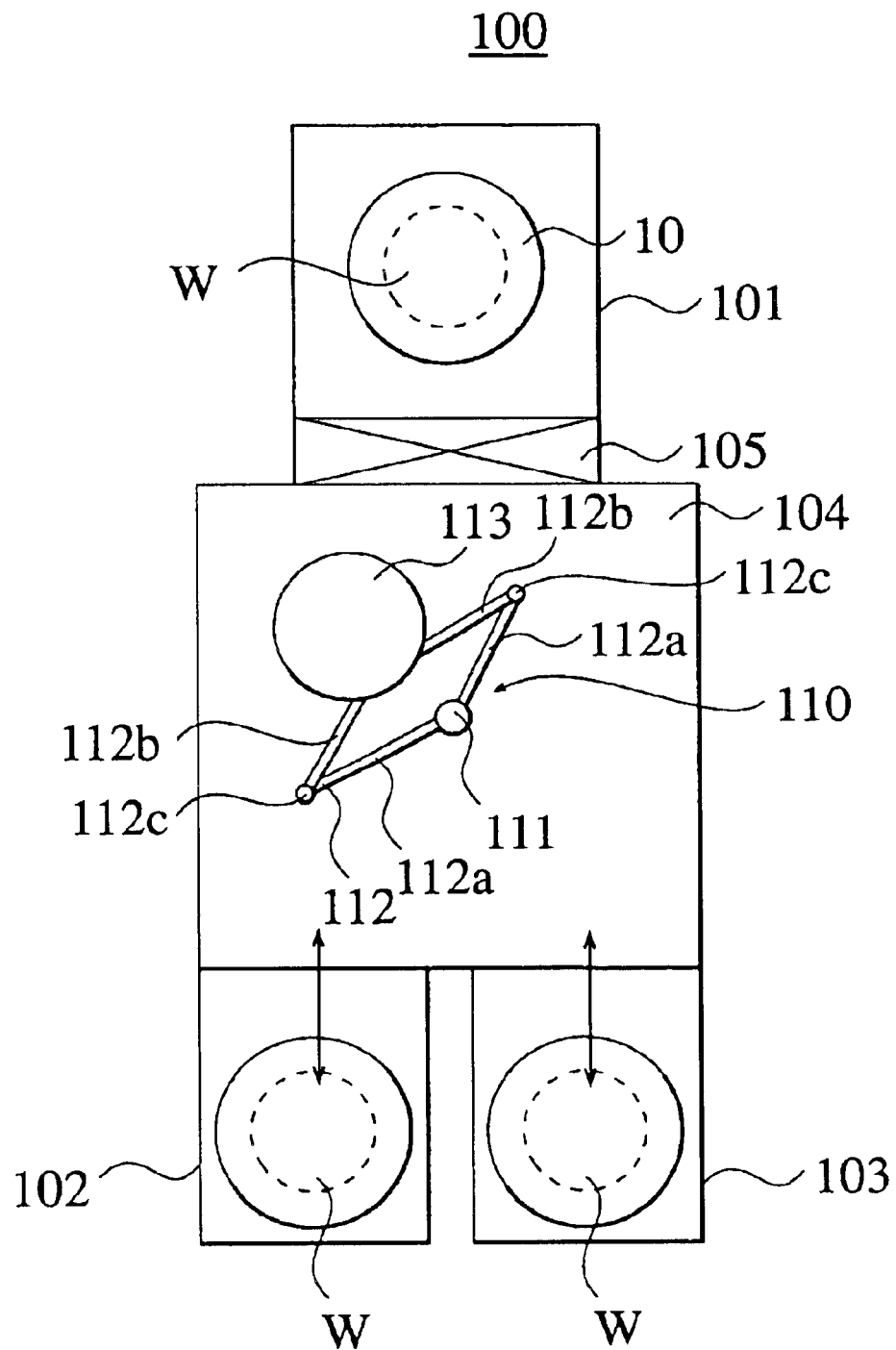
FIG. 3 is a plane view schematically showing a single wafer processing type vapor-phase epitaxial growth apparatus as an example of an apparatus according to the present invention.
Figure 4A:
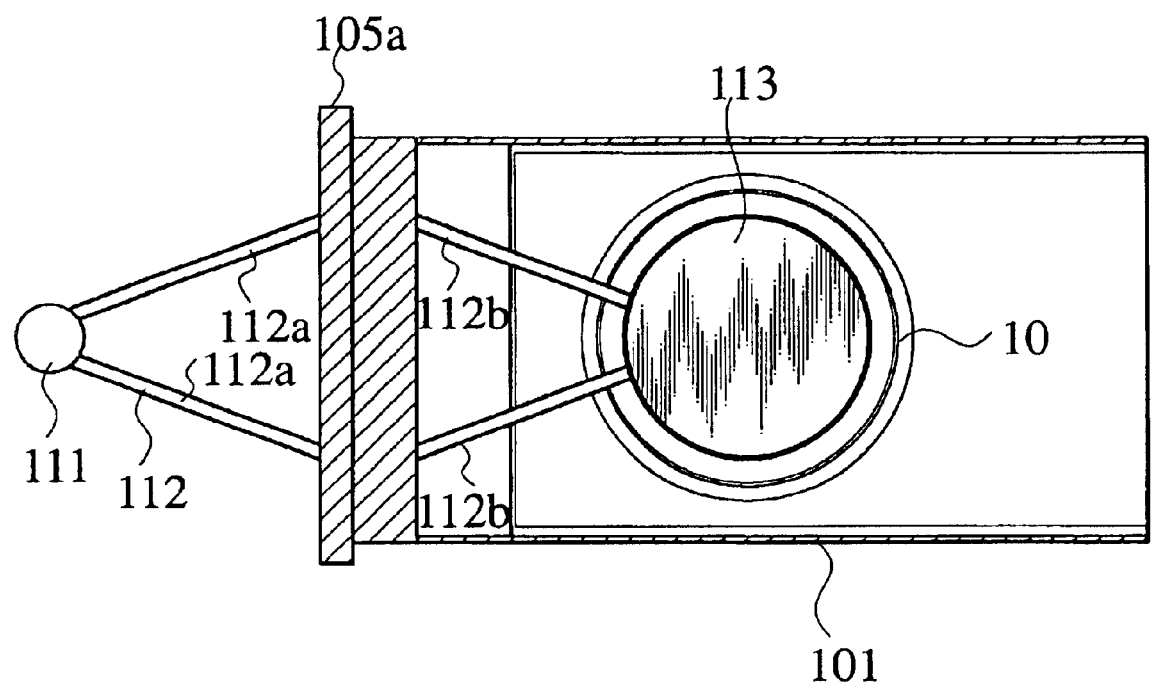
FIG. 4A is a plane-sectional view showing a chuck arrived over the susceptor in a reaction furnace of the vapor-phase epitaxial growth apparatus of FIG. 3.
Figure 4B:
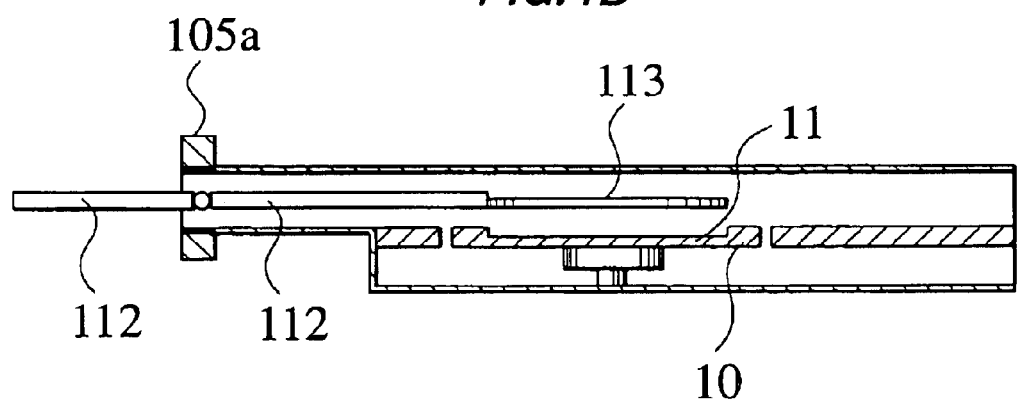
FIG. 4B is a cross-sectional view showing a chuck arrived over the susceptor in a reaction furnace of the vapor-phase epitaxial growth apparatus of FIG. 3.

The reaction furnace 101 is a place at which each of the wafers W transferred by the handler 110 is placed and vapor-phase epitaxial growth of the single crystal thin film is performed on a main surface of the wafer W. As shown in FIGS. 3, 4A and 4B, a susceptor 10 having a pocket 11 is arranged in the reaction furnace 101 to mount the wafer W in the pocket 11.

As shown in FIG. 1A, a large number of grooves 1 are formed on a bottom 11a of the pocket 11 in a lattice shape. As shown in FIG. 1B, each portion surrounded by the grooves 1 is a convexity 2. When a wafer W is mounted on the pocket 11, the wafer W comes in contact with the upper surface 2a of the convexity 2.

When a ratio (%) of the total area of the upper surfaces 2a of the convexities 2 to the area of the bottom 11a of the pocket 11 in the unit area of the pocket 11 is defined as a contact ratio of the pocket 11 with the wafer W, the bottom 11a of the pocket 11 is formed so as to set the contact ratio to 0.1% or more and 1.1% or less, more preferably 1% or less.

In the first method for adjusting the contact ratio within the range described above, an interval A of the convexities 2 is adjusted (by adjusting a groove width B) while fixing a size C (conveniently indicated by the length of a side of the top of the convexity in section, in FIG. 1B) of the upper surface 2a of the convexity 2 shown in FIG. 1B, so that the number of convexities 2 per unit area is increased or decreased.

In the second method, the interval A of the convexities 2 is fixed, and the size of the convexity 2, that is, the size C of the upper surface 2a of the convexity 2 is adjusted by adjusting the size of the groove width B.

In the third method, both the interval A (the groove width B) of the convexities 2 and the size C of the upper surface 2a of the convexity 2 are adjusted.

Next, a semiconductor wafer manufacturing method for performing vapor-phase epitaxial growth on a wafer W will be described with the operation of the vapor-phase growth apparatus 100.

After a pre-treatment wafer W mounted in either of the load-lock chambers 102 and 103 shown in FIG. 3 is initially placed temporarily at a temporary mounting place (not shown), the chuck 113 is moved to arrive at a position placed over the main surface of the wafer W, and the chuck 113 holds the wafer W by ejecting a gas from the chuck 113. The chuck 113 is then moved toward the reaction furnace 101 by expanding, contracting and rotationally moving the arm 112. After an open-close member 105a of the gate valve 105 is opened, the arm 112 is expanded to make the chuck 113 arrive at the position placed over the pocket 11 of the susceptor 10 (FIGS. 4A and 4B). The holding of the wafer W is then released, so that the wafer W is mounted in the pocket 11 (FIG. 2).

After the wafer W is mounted, the arm 112 is contracted to return the chuck 113 to the transfer chamber 104. The open-close member 105a of the gate valve 105 is then closed, and the vapor-phase epitaxial growth (heat treatment) for the wafer W in the reaction furnace 101 is started.

In the vapor-phase epitaxial growth, source material such as dichlorosilane, trichlorosilane or the like is supplied with a dopant gas on the main surface of the wafer W in a condition of the reaction furnace 101 heated up to about 1100° C. to 1200° C. The gas composition, the gas flow rate, the period of the gas supply and the temperature are appropriately set while considering the film thickness and the like of a desired silicon epitaxial wafer (semiconductor wafer).

After the vapor-phase epitaxial growth, the temperature in the furnace is set to a desired temperature of about 600° C. to 900° C. when a next pre-treatment wafer is mounted in the furnace.

After the vapor-phase epitaxial growth, the open-close member 105a of the gate valve 105 is opened, and the post-treatment wafer W is transferred to one of the load-lock chambers 102 and 103 by the handler 110. After the transfer, another pre-treatment wafer W from the load-lock chamber 102 or 103 is transferred to the reaction furnace 101 in the same manner, and the series of epitaxial growth treatment operations are started.

As described above, after the vapor-phase epitaxial growth, the temperature in the furnace is set to the desired temperature of about 600° C. to 900° C. when the next pre-treatment wafer is mounted in the furnace. However, when temperature in the furnace is relatively high as described in the following examples and comparative example, the contact ratio of the pocket with the wafer is preferably made small. On the other hand, when temperature in the furnace is relatively low, even though the contact ratio is larger, sufficient effect can be obtained. It is better to appropriately select the contact ratio in the range of 0.1% to 1.1% according to the operation conditions. For example, the contact ratio is preferably set to 0.1% to 0.3% at the temperature of about 900° C.

In the examples and comparative example described later, a semiconductor wafer manufacturing method for epitaxially growing the single crystal silicon thin film on a silicon wafer is described as an example. However, the present invention is effective to the process for forming a thin film of a distorted semiconductor layer such as SiGe or the like on a silicon wafer or other thin film forming processes.

EXAMPLE 1

In this example, a vapor-phase epitaxial growth is performed as a heat treatment for a wafer W by using a single wafer processing type vapor-phase growth apparatus 100 described in the embodiment, and a silicon epitaxial wafer denoting one type of semiconductor wafer is manufactured.

A pocket 11 made of carbon coated with silicon carbide is formed in a susceptor 10 arranged in a reaction furnace 101 of the vapor-phase growth apparatus 100. Two types of pockets having grooves 1 formed in the lattice shape are prepared as the pockets 11 so as to set a groove width B of a bottom 11a to (1) 3.64 mm (3.84 mm as an interval A of convexities 2) and (2) 1.72 mm (1.92 mm as the interval A of convexities 2). Each wafer W is then mounted on the pocket 11 to perform vapor-phase epitaxial growth.

The convexity 2 of each pocket 11 is formed in a trapezoid shape on the bottom and has an upper surface 2a of almost square shape having sides of about 0.2 mm. Therefore, a contact ratio of the pocket 11 with the wafer W is set to (1) 0.3% and (2) 1.1%, respectively.

Temperature in the reaction furnace 101 and the susceptor 10 is set to about 600° C. when a wafer W is transferred. A wafer W having a diameter of 200 mm is transferred by a chuck 113 and is mounted on the pocket 11 of the susceptor 10. In this embodiment, distance between the chuck 113 and the bottom 11a of the pocket 11 (distance from upper surface 2a of the convexity 2 to the chuck 113) is 5 mm.

After mounting the wafer W in the pocket 11, the chuck 113 is returned to a transfer chamber 104, an open-close member 105a of a gate valve 105 is closed, and vapor-phase epitaxial growth is started. After the vapor-phase growth, the open-close member 105a of the gate valve 105 is opened, the wafer W formed a single crystal thin film on the susceptor 10 is held by the handler 110 and is transferred to the load-lock chamber 102.

The treatment was performed by using two types of susceptors 10. The amount D of warp in the wafers W were (1) 0.01 mm and (2) 0.05 mm at the moment when each wafer W was mounted in the pocket 11, and no scratch was observed on the surface of each silicon epitaxial wafer manufactured according to the vapor-phase growth.

As described above, when the amount D of warp of a wafer is about 0.05 mm, influence such as generation of scratches on the wafer W is hardly exerted. That is, when a pocket is formed to set the groove width B to 1.72 mm or more and to set the contact ratio of the pocket 11 with a wafer W to 1.1% or less, upward warp of the wafer W occurring at the moment of mounting the wafer W can be sufficiently prevented.

COMPARATIVE EXAMPLE 1

In this Comparative Example, in the same manner as in the Example 1, the pockets 11 formed at the groove width B of (3) 1.08 mm (1.28 mm as the interval A of the convexities 2) and (4) 0.44 mm (0.64 mm as the interval A of the convexities 2) respectively are prepared. A wafer W is mounted in each pocket 11, and vapor-phase epitaxial growth is performed for the wafer W under the same conditions as those in the Example 1. The contact ratios of the wafers W with the pockets 11 are (3) 2.4% and (4) 9.8% respectively.

In the Comparative Example, the amount D of warp of the wafers W were (3) 2.9 mm and (4) 3.2 mm respectively at the moment when the wafers W were mounted in the pockets 11, so that remarkable upward warp was observed.

When a cold wafer W is mounted on the susceptor 10 heated up to about 600° C., the wafer W jumps up about 2 mm. Therefore, when vapor-phase epitaxial growth is performed by using the pocket 11 used in the Comparative Example, there is high possibility that scratches are generated on the surface of the wafer W by contacting the wafer W with the chuck 113 placed over the wafer W.

To compare a vapor-phase epitaxial growth method in the Example 1 with that in the Comparative Example, the contact ratio (%) of the pocket with the wafer W for each of the pockets (1) to (4) and the amount D of warp of the wafer W measured by using each pocket are shown in Table 1.

TABLE 1

| susceptor | interval A of convexities (mm) | Groove width B (mm) | Contact ratio (%) | amount D of warp of wafer (mm) |
|---|---|---|---|---|
| (1) | 3.84 | 3.64 | 0.3 | 0.01 |
| (2) | 1.92 | 1.72 | 1.1 | 0.05 |
| (3) | 1.28 | 1.08 | 2.4 | 2.9 |
| (4) | 0.64 | 0.44 | 9.8 | 3.2 |

Figure 5A:
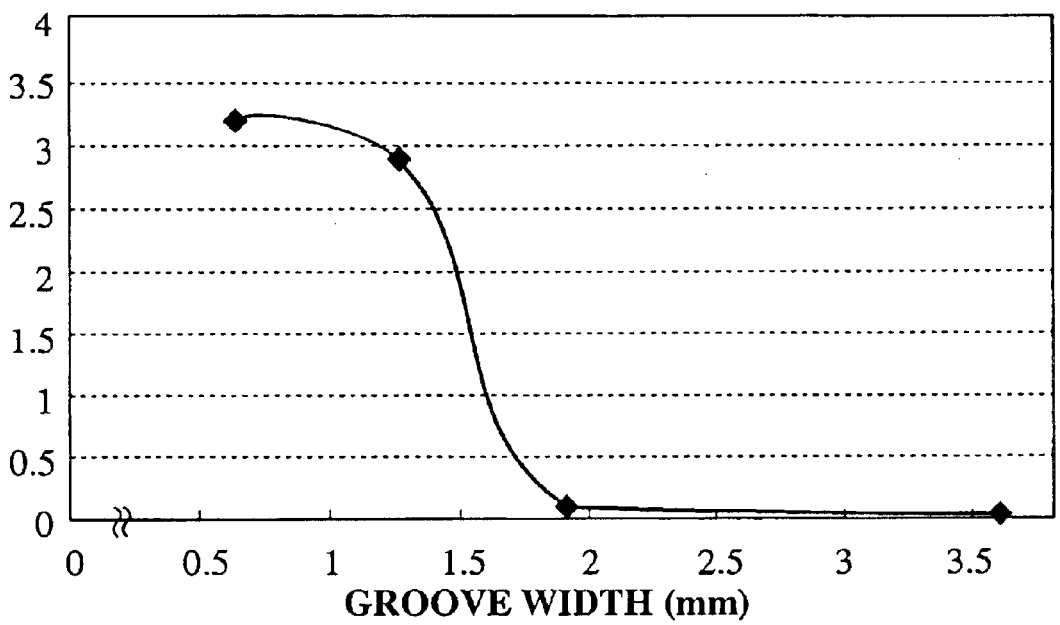
FIG. 5A is a graph showing an amount of warp of a wafer W with respect to groove width when the wafer W is mounted in each of pockets having different contact ratios.
Figure 5B:
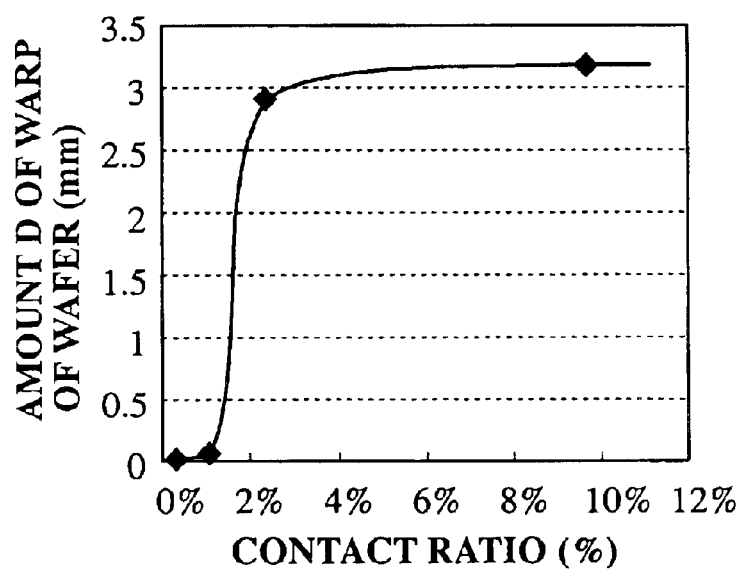
FIG. 5B is a graph showing an amount of warp of a wafer W with respect to contact ratio when the wafer W is mounted in each of pockets having different contact ratios.
Figure 6:
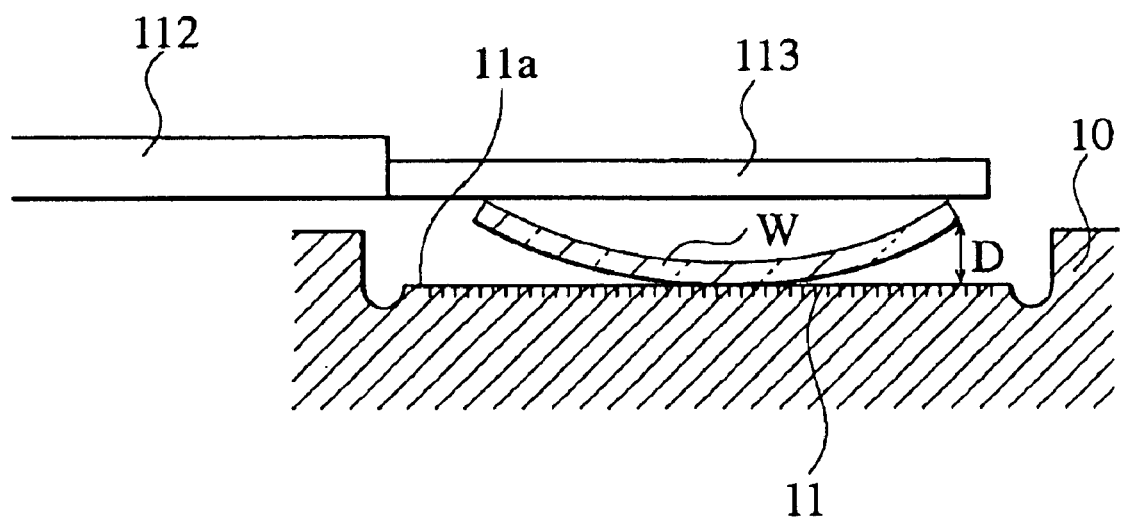
FIG. 6 is a cross-sectional view showing that a wafer transferred by the chuck of FIG. 3 is warped upward at the moment when the wafer is mounted in the pocket of the susceptor.

A graph of the amount D of warp of the wafer W with respect to each groove width B is shown in FIG. 5A, and a graph of the amount D of warp of the wafer W with respect to each contact ratio is shown in FIG. 5B.

In FIGS. 5A and 5B, when the contact ratio is changed from 2.4% to 1.1% (the interval A of the convexities is changed from 1.28 mm to 1.92 mm, and the groove width B is changed from 1.08 mm to 1.72 mm), it is understood that the amount D of warp of the wafer W is rapidly reduced from 2.9 mm to 0.05 mm.

Accordingly, when the contact ratio of the pocket 11 with the wafer W is set to 1.1% or less, or preferably set to 1% or less (the groove width of 1.8 mm or more), the amount of instantaneous warp occurring at the moment of mounting a wafer can be considerably made small, and generation of scratches due to warp can be prevented. Therefore, this method is effective for manufacturing a silicon epitaxial wafer.

COMPARATIVE EXAMPLE 2

In this Comparative Example, a pocket having a larger groove width B and a smaller contact ratio with a wafer W is formed in a susceptor 10, vapor-phase epitaxial growth is performed for the wafer W under the same conditions as those in the Example 1, and a silicon epitaxial wafer is manufactured.

As a result, when the contact ratio of the pocket 11 with the wafer W is set to be lower than 0.1% (the groove width B is larger than about 6.1 mm), occurrence of slip dislocation in the wafer W is found out.

Accordingly, the contact ratio of the pocket 11 with the wafer W is preferably set to be 0.1% or more.

EXAMPLE 2

In this Example, a pocket 11 formed at the groove width B of (1) 3.64 mm (3.84 mm as the interval A of the convexities 2, and the contact ratio of 0.3% with a wafer W) is prepared. Temperature of the susceptor 10 is set to about 900° C. when a wafer W is mounted in the pocket 11, vapor-phase epitaxial growth is performed for the wafer W under the same conditions as those in the Example 1, and a silicon epitaxial wafer is manufactured.

As a result, no generation of scratches is found out on the surface of the manufactured silicon epitaxial wafer. Accordingly, when the contact ratio of the pocket 11 with the wafer W is set to 0.3%, even though the temperature of the susceptor 10 is set to about 900° C., the silicon epitaxial wafer can be appropriately manufactured.

COMPARATIVE EXAMPLE 3

In this Comparative Example, a pocket 11 formed at the groove width B of (2) 1.72 mm (1.92 mm as the interval A of the convexities 2, and the contact ratio of 1.1% with a wafer W) is used, and vapor-phase epitaxial growth is performed for the wafer W under the same conditions as those in the Example 2. As a result, scratch(es) generated due to the contact with the chuck 113 are found out on the surface of the manufactured silicon epitaxial wafer.

Accordingly, in a case where the temperature of the susceptor 10 mounting a wafer W exceeds 900° C., when the contact ratio of the pocket 11 with the wafer W is set to 0.3% or less, warp of the wafer can be sufficiently and appropriately suppressed.

The grooves 1 formed at the bottom 11a of the pocket 11 are not limited to the shape shown in FIG. 1. For example, the grooves 1 are not limited to the lattice shape. Further, it is not required that the groove width B, the intervals of the grooves 1, the shape of each convexity 2, or the area of the upper surface 2a of each convexity 2 is uniformly set in the whole bottom 11a.

Moreover, the groove forming method is not limited. For example, the grooves 1 may be formed by cutting, may be formed by arranging convexities on the surface, and may be integrally formed.

As to the configuration of each apparatus performing the heat treatment for the wafer, the present invention is not limited to the configuration of the vapor-phase growth apparatus according to the embodiment, and the configuration of the vapor-phase growth apparatus can be appropriately changed.

As described above, the grooves 1 of the lattice shape are formed on the bottom 11a of the pocket 11 of the susceptor 10 mounting a wafer W. The wafer W comes in contact with the upper surfaces 2a of the convexities 2 of the pocket 11 surrounded by the grooves 1. The amount of warp of the wafer occurring at the moment of mounting the single crystal silicon wafer on the susceptor at high temperature can be reduced by adjusting the contact ratio (contact area per unit area) of the pocket 11 with the wafer W while adjusting the intervals A of the convexities 2, the size of the upper surfaces 2a of the convexities 2 and/or the groove width B.

INDUSTRIAL APPLICABILITY

According to the present invention, upward warp of a wafer occurring at the moment of mounting the wafer on a susceptor can be considerably reduced. Further, because the contact of the wafer with a member placed close to a transferring unit or the like can be prevented by reducing warp of the wafer, the present invention is appropriate. Accordingly, the semiconductor wafer manufacturing method and the susceptor used therefor according to the present invention are particularly appropriate to manufacture a semiconductor from a single crystal silicon wafer.

What is claimed is:

1. A method of manufacturing a semiconductor wafer, comprising mounting a single crystal silicon wafer in a pocket arranged in a susceptor, and performing heat treatment for the single crystal silicon wafer to manufacture the semiconductor wafer, wherein a contact ratio of the pocket with the single crystal silicon wafer is set to 0.1% or more and 1.1% or less.

2. The method of manufacturing the semiconductor wafer as claimed in claim 1, wherein a width of a groove formed in the pocket is set to 1.8 mm or more.

3. The method of manufacturing the semiconductor wafer as claimed in claim 1, wherein the contact ratio is set to 0.1% or more and 1% or less.

4. The method of manufacturing the semiconductor wafer as claimed in claim 1, wherein a material of the susceptor is carbon coated with silicon carbide.

5. A method of manufacturing a semiconductor wafer, comprising mounting a single crystal silicon wafer in a pocket arranged in a susceptor, and performing heat treatment for the single crystal silicon wafer to manufacture the semiconductor wafer, wherein a contact ratio of the pocket with the single crystal silicon wafer is set to 0.1% or more and 0.3% or less when a temperature in the susceptor is about 900° C.

6. A susceptor having a pocket for mounting a single crystal silicon wafer and used to manufacture a semiconductor wafer, wherein a contact ratio of the pocket with the single crystal silicon wafer is set to 0.1% or more and is set to 1.1% or less.

7. The susceptor as claimed in claim 6, wherein a width of a groove formed in the pocket is set to 1.8 mm or more.

8. The susceptor as claimed in claim 6, wherein the contact ratio is set to 0.1% or more and 1% or less.

9. The susceptor as claimed in claim 6, wherein a material of the susceptor is carbon coated with silicon carbide.

10. A susceptor having a pocket for mounting a single crystal silicon wafer and used to manufacture a semiconductor wafer, wherein a contact ratio of the pocket with the single crystal silicon wafer is set to 0.1% or more and 0.3% or less when a temperature in the susceptor is about 900° C.

* * * * *